United States Patent [19]

Havot et al.

[11] Patent Number: 5,121,078

[45] Date of Patent: Jun. 9, 1992

[54] FILTERING CELL AND CORRESPONDING FILTER

[75] Inventors: Henri Havot, Cesson Sevigne; Yvon Dutertre, Acigne, both of France

[73] Assignees: French State Represented by the Minister of Post, Telecommunications and Space (Centre National D'Etudes Des Telecommunications), both of Issy Les Moulineaux; Telediffusion de France, both of Issy Les Moulineaux, France

[21] Appl. No.: 599,690

[22] Filed: Oct. 18, 1990

[30] Foreign Application Priority Data

Oct. 19, 1989 [FR] France .................... 89 13687

[51] Int. Cl.⁵ .................................. H03H 7/07
[52] U.S. Cl. ................................... 333/170; 333/172; 333/176; 333/204
[58] Field of Search ........ 333/167, 168, 170, 171–176, 333/219, 204

[56] References Cited

U.S. PATENT DOCUMENTS

| | | | |
|---|---|---|---|
| 1,611,932 | 12/1926 | Mathes | 333/177 |
| 1,814,238 | 7/1931 | Bode | 333/168 |
| 1,897,639 | 2/1933 | Kreer, Jr. | 333/170 |
| 2,762,018 | 9/1956 | Purrington | 333/170 |
| 2,832,047 | 4/1958 | Miller | 333/171 X |
| 3,103,554 | 9/1963 | Avins et al. | 333/176 X |
| 4,264,881 | 4/1981 | De Ronde | 333/204 X |

FOREIGN PATENT DOCUMENTS

| | | | |
|---|---|---|---|
| 1214809 | 2/1963 | Fed. Rep. of Germany | 333/170 |
| 0841560 | 9/1956 | United Kingdom | 333/170 |

OTHER PUBLICATIONS

Gourevitch, "Les filtres elliptiques plats", Toute L-electronique, Aug./Sep. 1976, pp. 59–63.

Primary Examiner—Eugene R. Laroche
Assistant Examiner—Seung Ham
Attorney, Agent, or Firm—Pearne, Gordon, McCoy & Granger

[57] ABSTRACT

A filtering cell including a resonant circuit having an inductor and capacitor connected in parallel, the inductor being separated into two identical inductors which are connected in series with a midpoint therebetween. A second capacitor is connected at the midpoint and has a quality factor substantially equal to a quality factor of the first inductor, resulting in attenuation at the resonant frequency. Each of the inductors and capacitors are formed by micro-ribbon technology.

3 Claims, 10 Drawing Sheets

FILTERING CELL AND CORRESPONDING FILTER

BACKGROUND OF THE INVENTION

1. Field of the Invention

The purpose of this invention is a filtering cell and a corresponding filter. It has many applications in electronics, particularly in the manufacture of rejection, low-pass and high-pass filters. This filtering technique can be applied, especially, in video communications cable networks when certain television channels must be filtered.

The invention applies to all filters with one or more cells including a resonant circuit composed of at least one first type of inductive or capacitive reactance (this reactance being either an inductance or a capacitor) and at least one second type of reactance opposed to the first, capacitive or inductive (therefore consisting of a capacitor or an inductance). Such cells may be laid out in series or parallel, with $\pi$, T or trellis-shaped structures etc. However to simplify the description that follows, we shall limit ourselves to resonant-parallel-type cells, mounted in series with no limitation on the scope of the invention.

DESCRIPTION OF THE RELATED ART

Figure 1:
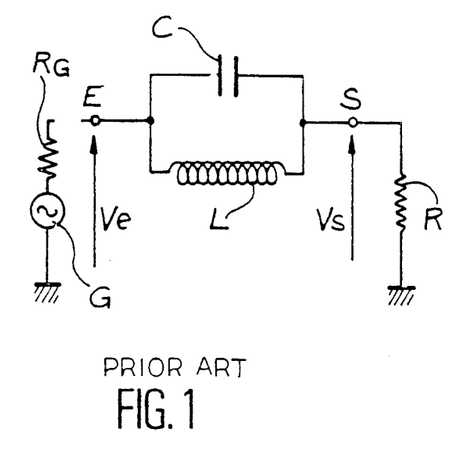
FIG. 1, already described, shows a rejection filter cell according to the prior state of the art, FIGS. 2A and 2B, already described, show the theoretical attenuation and the attenuation actually obtained with a filter of the prior state of the art in FIG. 1, FIGS. 3A to 3F, already described, show performance curves for cells of the prior state of the art with a correction resistor.

A resonant-parallel-type filtering cell according to the prior state of the art is shown in FIG. 1, which is attached. This cell includes a capacitor C and an inductance L forming a resonant circuit at the frequency $Fo = \frac{1}{2}\pi\sqrt{LC}$. One input E is connected to an impedance generator G with an output $R_G$ and one output S to a load R. The voltages at input E and output S are marked respectively Ve and Vs.

Figure 2:
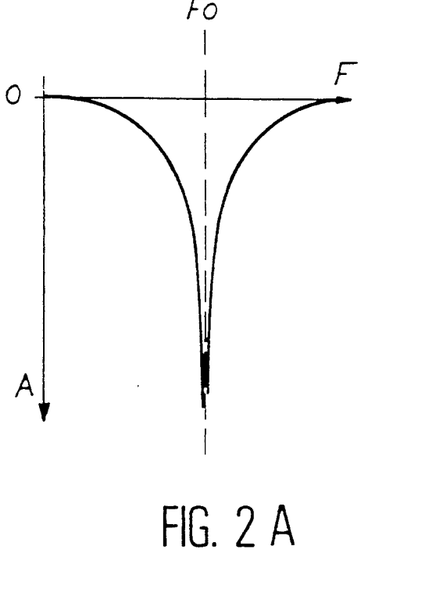

The theoretical response of such a filter is shown in FIG. 2A. The axis of the ordinate contains the attenuation A, i.e., the ratio Vs/Ve, measured in decibels (this ratio is negative). The axis of the abscissa corresponds to the frequency F. At the frequency Fo, the attenuation is, in principle, infinitely great.

In reality, the components used to make such a cell are not perfect, and the inductance, in particular, has a resistance that is far from negligible. The damping that results has the effect of substantially changing the attenuation curve, which then takes the form shown in FIG. 2B. There is still a frequency where the attenuation is maximum (in absolute value), but this attenuation has a finite value (for example 20 or 30 dB). It can prove insufficient in practice when it is a question of effective rejection or obtaining a clean cut.

We know how to correct a parallel cell LC mounted in series by splitting the capacitor in two and connecting a resistor connected to the mass to the midpoint found this way. The rejection obtained is great, but the losses above and beyond the rejected frequency are great. Moreover, the match is not satisfactory.

Figure 3A:
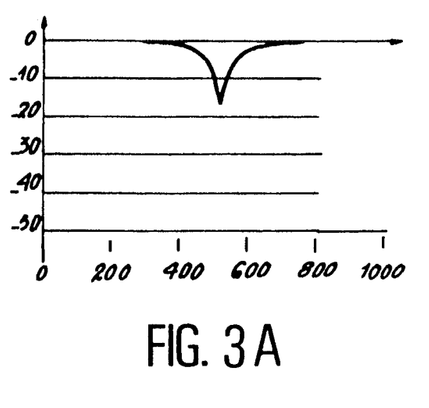
Figure 3B:
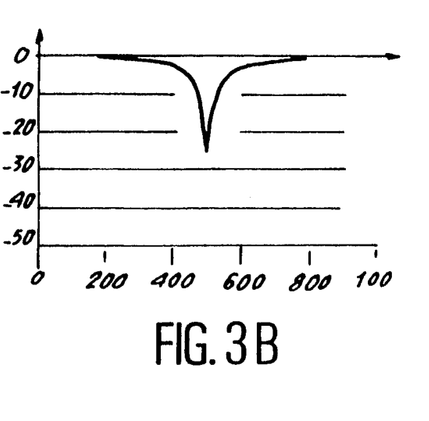
Figure 3C:
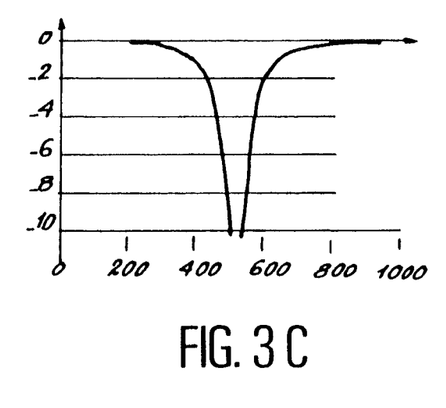
Figure 3D:
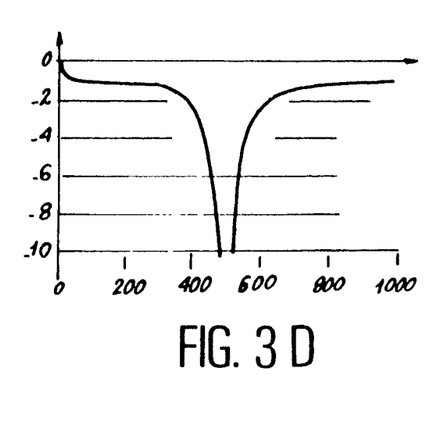

FIGS. 3A to 3F provide details on these questions. FIG. 3A, first of all, shows the attenuation of a particular uncorrected cell LC where the attenuation is put on the ordinate and the frequency on the abscissa. At the rejection frequency, the attenuation is $-18$ dB. By correcting the cell with a simple resistor, one obtains the values in FIG. 3B. The attenuation to rejection is $-28$ dB. FIG. 3C shows more precisely the attenuation of the rejection frequency for the uncorrected cell LC. For example, one obtains 0.2 dB to 800 MHz and 2 dB to 600 MHz FIG. 3D likewise shows this attenuation for the same cell corrected with a resistor. An attenuation of 1.2 dB to 800 MHz and 2.5 dB to 600 MHz is obtained.

Figure 3E:
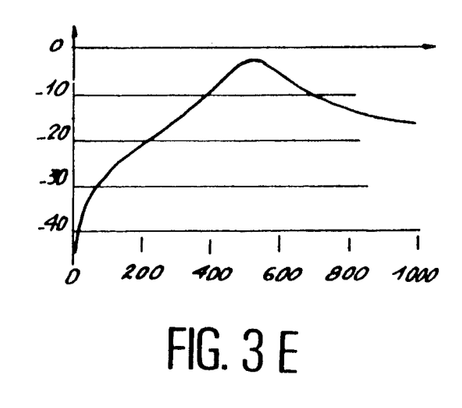
Figure 3F:
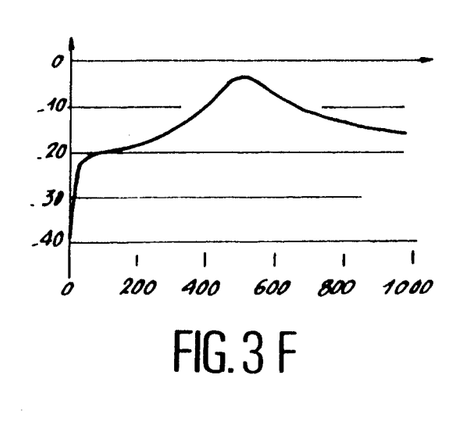

FIGS. 3E and 3F show the mismatching of the cell respectively uncorrected ($-13$ dB to 800 MHz) and corrected with a resistor ($-13$ dB to 800 MHz)

SUMMARY OF THE INVENTION

This invention has as its purpose to eliminate these drawbacks and is aimed at simply correcting the existing filters to obtain both greater attenuation at the resonance frequency Fo and better adaptation at low frequencies. In other words, the slope of the line joining the point of the attenuation curve at the frequency Fo and the point of that same curve at a certain lower frequency is increased substantially in relation to the prior state of the art.

After theoretical and experimental work on filters, the inventors found that the defect in quality of the inductance or the capacitor was not an insurmountable handicap, but could be corrected if a capacitor with an appropriate value is put with the inductance or an inductance with an appropriate value is put with the capacitor. In other words, the invention proposes to correct the quality coefficient of the resonant circuit and to do so either by acting on the inductance or on the capacitor or both.

With the cell thus corrected, the inventors showed that attenuation at the resonance frequency was substantially increased.

It must be observed that the frequency corresponding to maximum attenuation is displaced slightly by adding the correction reactance. If need be, this effect can always be corrected by modifying the value of the reactances of the cell to put the frequency back at the value before correction. For example, in the case of a correction of the inductance, it will suffice to increase the value of the main capacitor by a fraction of the capacity of the correction capacitor.

The advancement brought by the invention is accompanied by another advantage, which is to perfect the matching of the impedance of the filtering cell. After correction, the part of the energy reflected by the cell falls to a very low value ($-20$ dB for example) for frequencies below the resonance frequency. In other words, the reflection coefficient is quasi-zero and the stationary wave rate near unity.

One will note that these high performances are obtained despite the mediocre quality of the inductance or the capacitor. The filtering cell in the invention can thus be accommodated to inexpensive components.

Moreover, as will be better understood later on, the invention lends itself particularly to the micro-ribbon technology where inductances can have a mediocre quality coefficient on certain substrates, which has a tendency to downgrade the performance of the filters.

To be precise, the purpose of the invention is therefore a filtering cell with a resonant circuit composed of at least one first reactance of a first type (inductive or capacitive) and at least one second reactance of a second type opposite the first (capacitive or inductive), with this cell characterized by the fact that at least one of the two reactances is separated into two parts placed in series with a midpoint and includes a correction reactance connected to said midpoint, and this correction reactance is the opposite type reactance on which the correction was made, (capacitive if the reactance on which one is acting is inductive type and inductive if the reactance on which one is acting is capacitive type), and this correction reactance must have an appropriate quality coefficient.

Two methods of execution are provided, depending on whether one corrects the inductance (with a capacitor) or the capacitor (with an inductance).

Although any type of cell may be used, the resonant-parallel type cell, mounted in series, seems to lend itself particularly well to the application in the invention.

According to the invention, the correction capacitor may be no longer localized, but may be distributed.

This invention also has as its purpose a filter with a large number of filtering cells, and this filter is characterized by the fact that at least one of these cells conforms to any one of the cells just defined.

BRIEF DESCRIPTION OF THE DRAWINGS

In any case, the characteristics and advantages of the invention will be better seen in light of the description that follows. This description covers examples of execution given for explanatory purposes which are in no way limiting, and it refers to the attached drawings where.

DETAILED DESCRIPTION OF THE PREFERRED EMBODIMENTS

Figure 4:
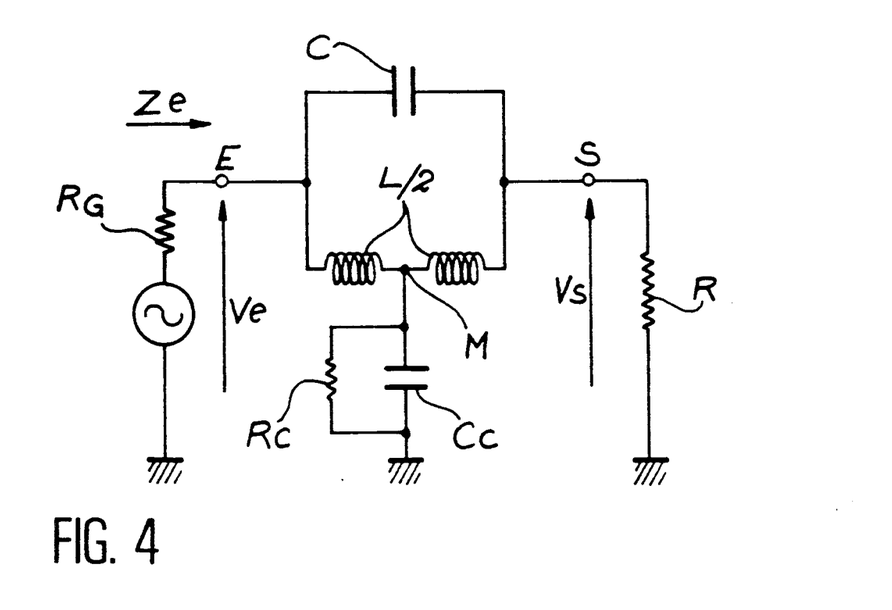
FIG. 4 shows a filter according to the invention in a variation with a resonant-parallel-type cell, mounted in series, with correction on the inductance.

FIG. 4 shows a filtering cell according to the invention, in the special case of a resonant-parallel cell mounted in series and in a method of execution corresponding to a correction on the inductance. As already described for FIG. 1, this cell has a capacitor C and an inductance with the value L, but the latter is shared by two inductances with the value $L/2$ and a midpoint M. A correction capacitor Cc is connected between the midpoint M of the inductance and the ground. This capacitor has a resistor Rc either intrinsically or via a resistor intentionally connected in parallel. The value of the capacitance Cc is equal at $L/R^2$, where L is the sum of the two halves of the inductance $(L/2 + L/2)$ and R is the value of the load. As for the quality coefficient RcCcw, it is equal to that of the inductance or Lw/r, where r is the resistance of the inductance and W is the angular pulsation $2\pi F$, where F is the frequency. The resistance Rc is therefore equal to L/rCc.

Figure 5:
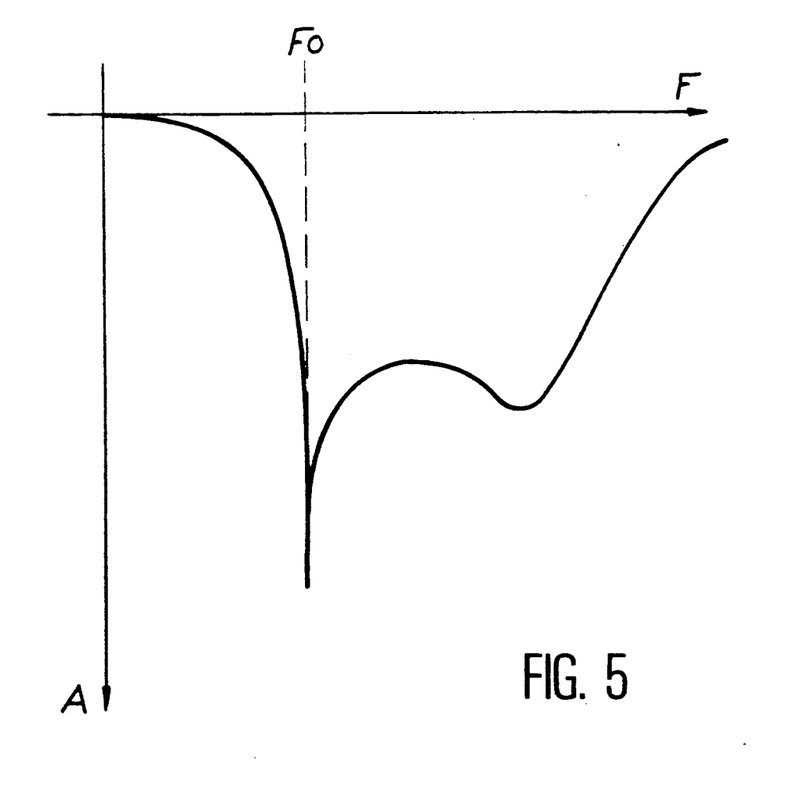
FIG. 5 shows the attenuation obtained with a filter in FIG. 4.
Figure 6:
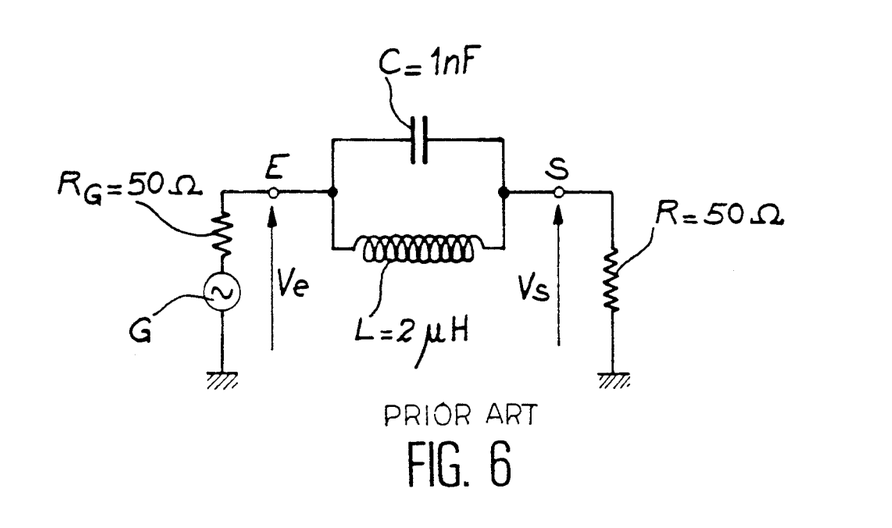
FIG. 6 shows a practical case of execution of a rejection filter according to the prior state of the art.

The attenuation obtained under these conditions is shown in FIG. 5. At the frequency Fo, the attenuation is substantially greater than in the prior state of the art (see FIG. 3). Moreover after the frequency Fo, a second pole or point of rejection appears. Generally, these changes are not important where it is a question of cutting the frequency Fo or obtaining a low-pass filter.

The curves in FIGS. 6 to 11 make it possible better to judge the improvements made by the invention. First of all, FIG. 6 corresponds to a filter of the prior state of the art, with a 2 $\mu$H inductance and a 1 nF capacitor.

Figure 8:
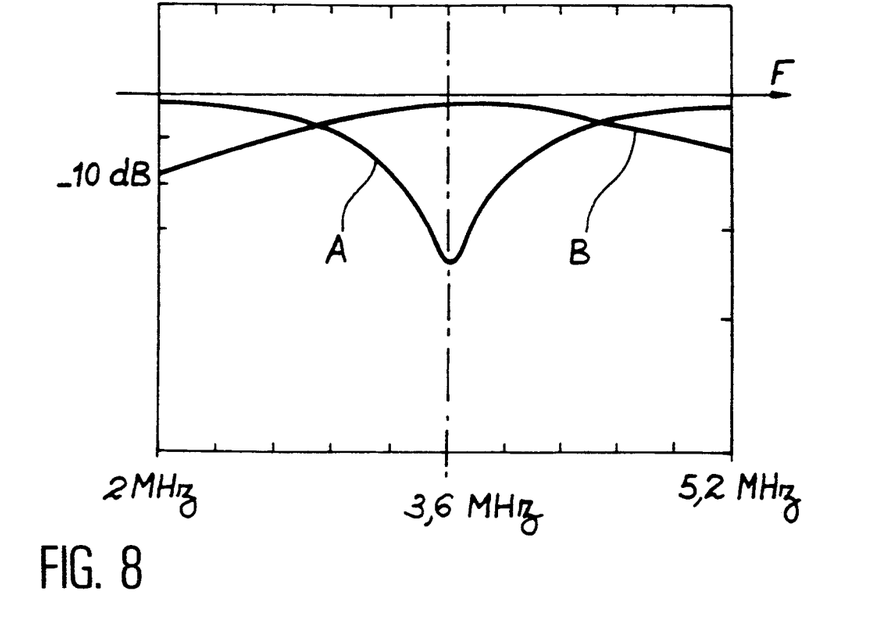
FIGS. 8 and 9 show the rejection of the filter in FIG. 6, FIGS. 10 and 11 show the rejection of the filter in FIG. 7.
Figure 9:
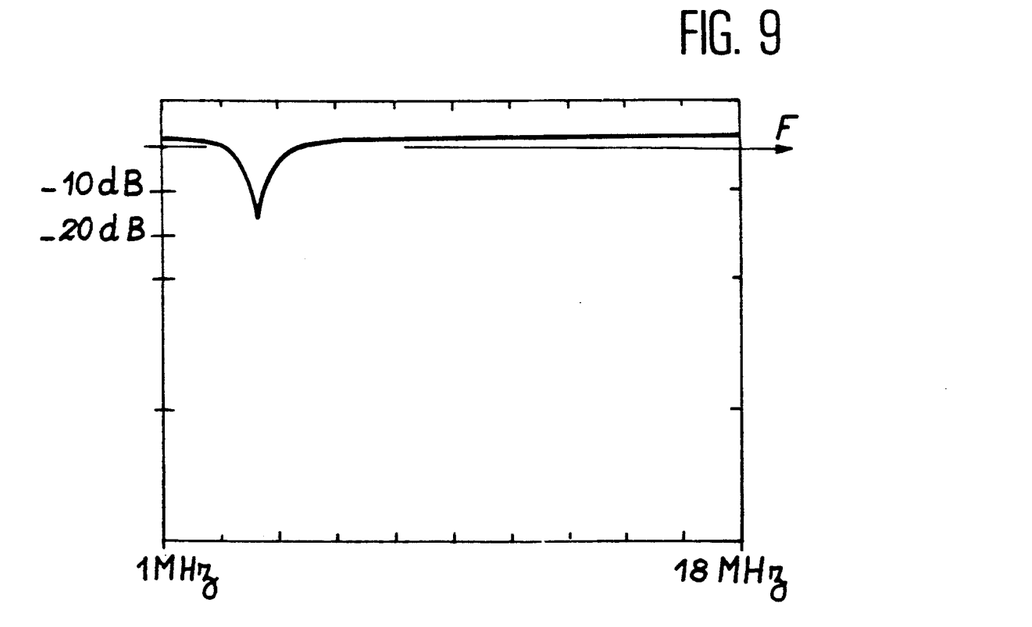

FIG. 8 shows the performance of this filter. The axis of the abscissa shows the frequency, which ranges from 2 MHz to 5.2 MHz. The central frequency is equal to 3.6 MHz. The axis of the ordinate shows the attenuation on a scale divided into 5 dB sections.

Curve A corresponds to the attenuation measured. At best, it is equal to $-18$ dB for Fo=3.6 MHz. Curve B corresponds to the mismatch which is $-9$ dB at the start of the range.

Figure 10:
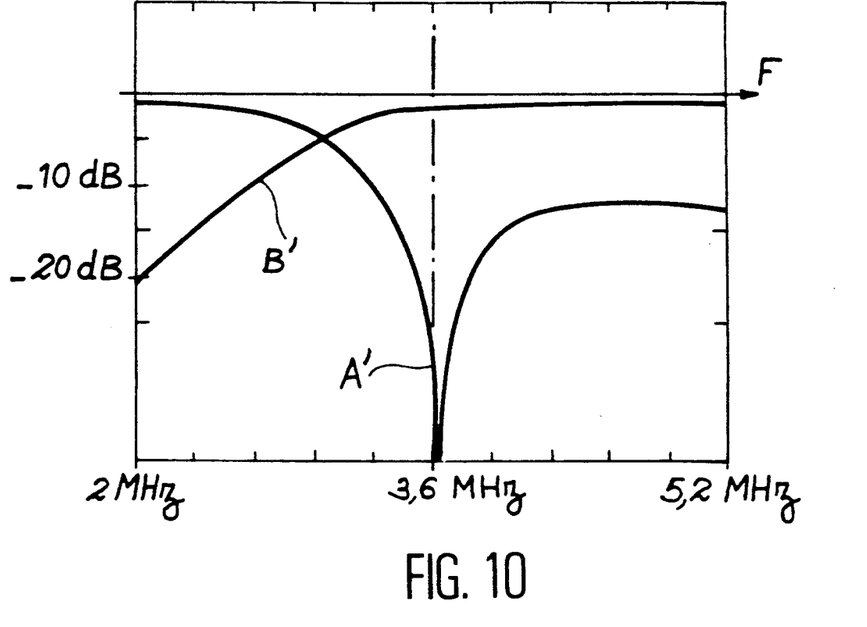
Figure 11:
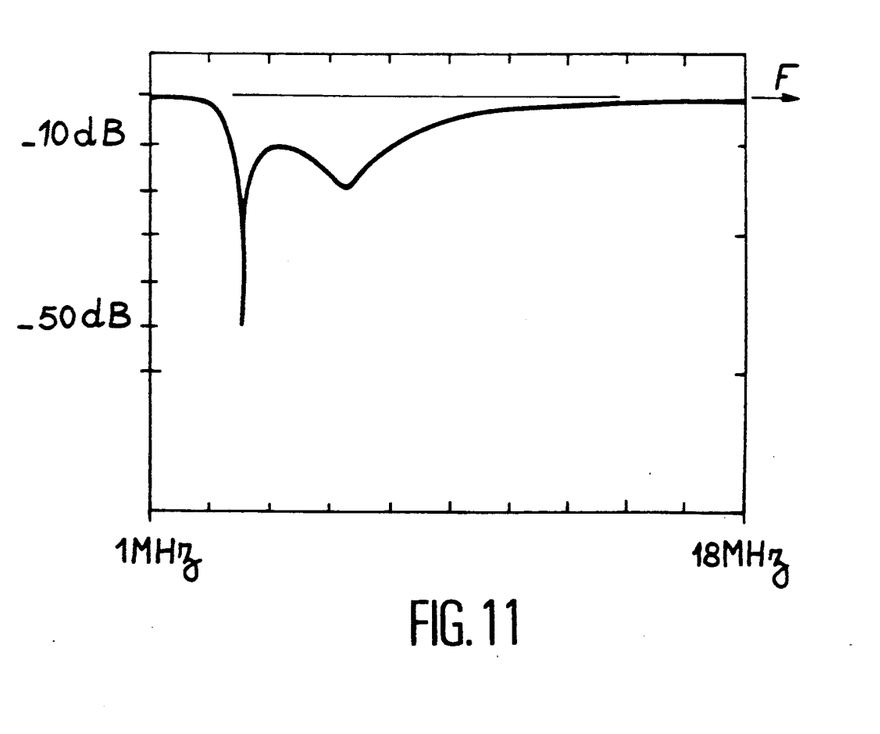

The performance of the same filter corrected with a capacitor with a value Cc=820 pF with Rc=330 $\Omega$ (see FIG. 7) is shown in FIG. 10 on the same scale: the attenuation A' falls to $-40$ dB and the mismatch B' to $-20$ dB.

Figure 7:
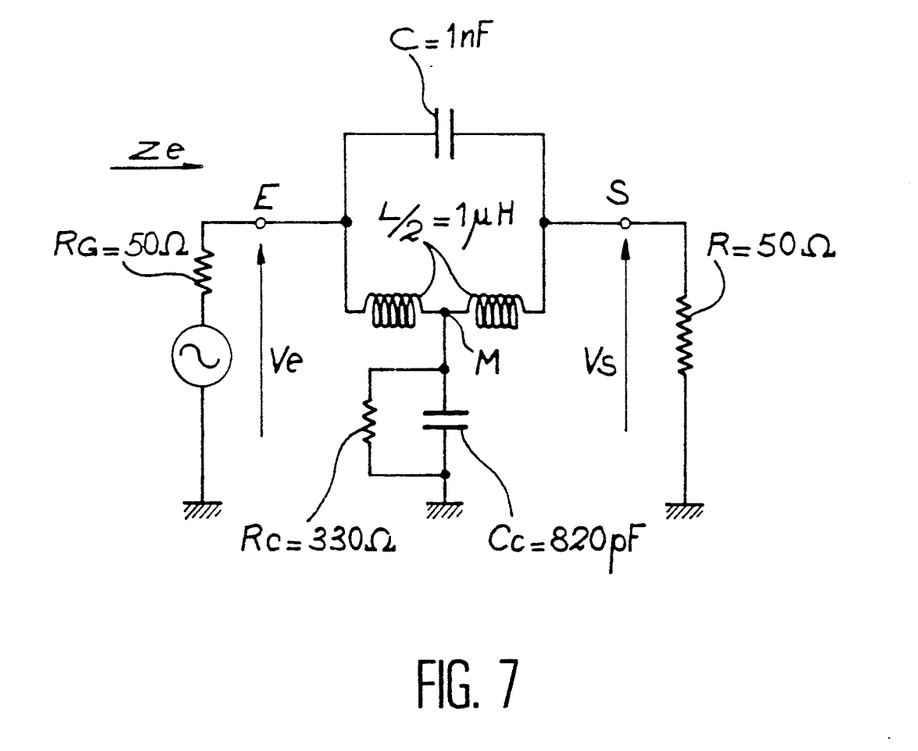
FIG. 7 shows a practical case of execution of a rejection filter according to the invention, with correction on the inductance.

Curves 9 and 11 make it possible to compare the filters with discrete components according to the prior state of the art (FIG. 6) and according to the invention (FIG. 7). In both cases the axis of the abscissa extends from 1 MHz to 18 MHz. The axis of the ordinate shows an attenuation with 10 dB per division. The filter of the prior state of the art has an attenuation of around 18 dB (FIG. 9), while the same filter corrected according to the invention, by adding a capacitor, has its attenuation fall to $-50$ dB, which represents a considerable improvement, considering the modesty of the change.

Figure 12:
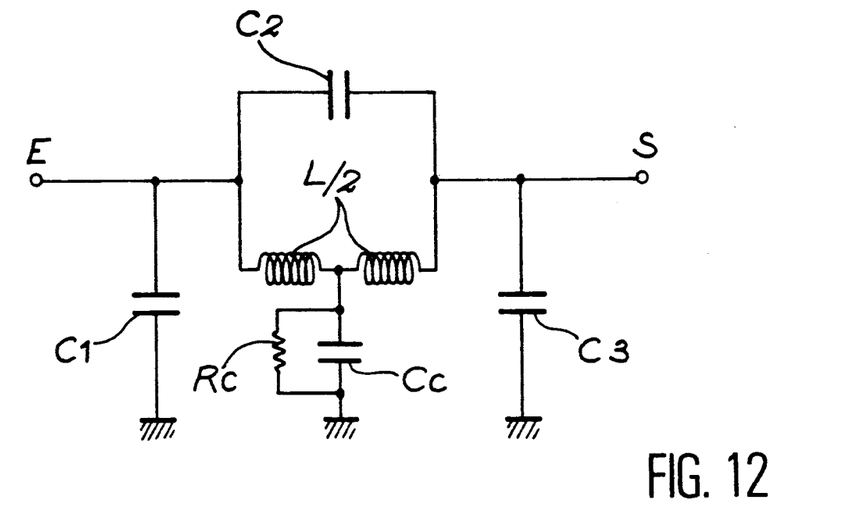
FIG. 12 illustrates a cell in $\pi$, corrected according to the invention.

The invention is not limited to resonance-parallel-type cells, mounted in series, but extends to other types like cells in II an example of which is given in FIG. 12. Such a cell includes three capacitors C1, C2. C3 and, according to the invention, one inductance formed from two semi-inductances $L/2$, with a correction capacitor Cc with a parallel resistor Rc.

Figure 13:
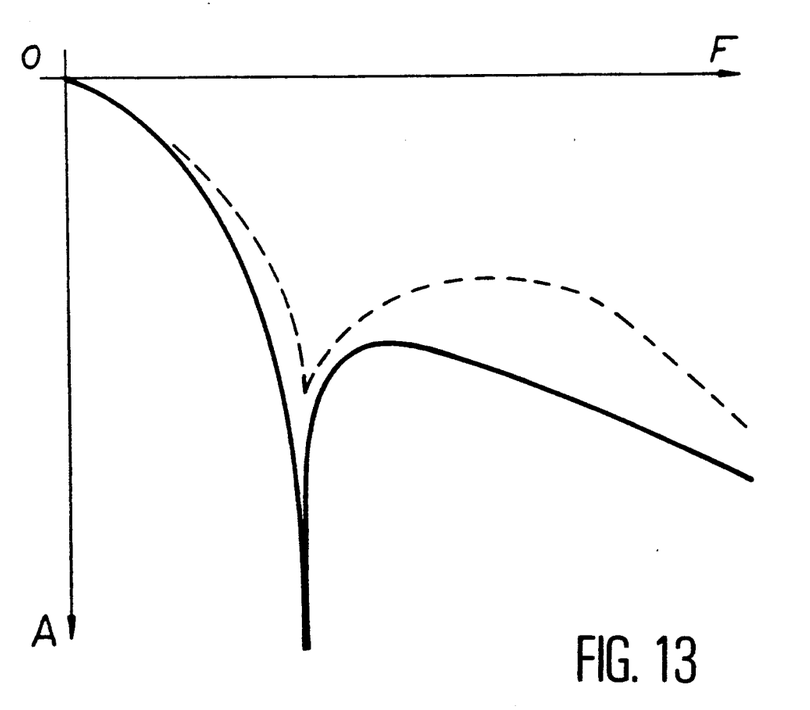
FIG. 13 shows the attenuation obtained with the preceding filter.

The corresponding attenuation curve is shown in FIG. 13 in a continuous line; the part with dashes shows the curve obtained without correction, according to the prior state of the art.

The invention is not limited to a single filtering cell, either, but encompasses any filter with several cells, at least one of which is corrected as just explained.

Figure 14:
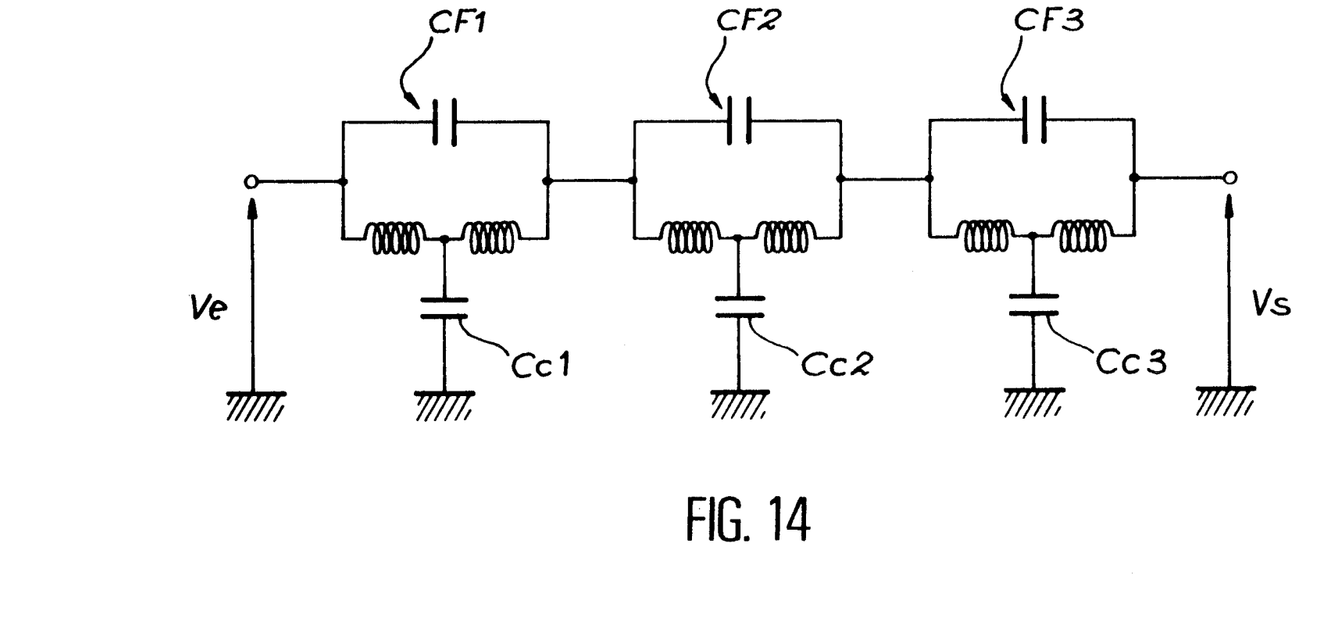
FIG. 14 shows a rejection filter with three cells according to the invention.

FIG. 14 shows a filter with three filtering cells CF1, CF2, CF3, all three conforming to the invention, with three correction capacitors Cc1, Cc2. Cc3. The rejection frequencies may be completely different. The quality coefficients of the capacitors Cc1 , . . . , must be identical in value to the value of the quality coefficients of the associated inductances.

Figure 15:
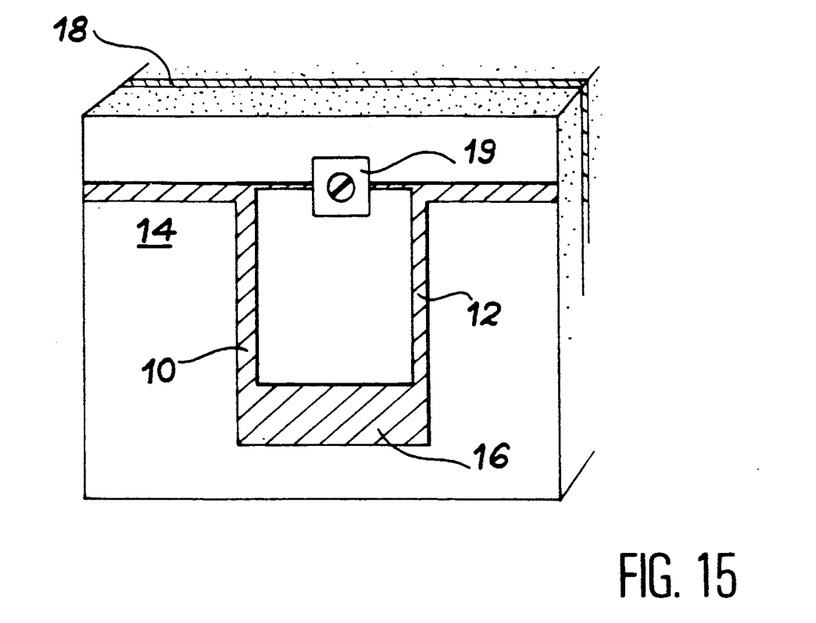
FIG. 15 illustrates a method of execution of a micro-ribbon cell.

Although this initial version of the invention may be made with discrete components, it is more convenient, when the working frequency range reaches and exceeds a gigahertz, to achieve inductance of the filter in the form of a micro-ribbon conductor. The invention lends itself particularly well to this technology. Indeed, in this case, as shown in FIG. 15, a filtering cell according to the invention can include two micro-ribbons 10 and 12 deposited on an insulating substrate 14.

These two micro-ribbons, which can be any geometric shape, consist of two semi-inductances and also include a micro-ribbon 16. This micro-ribbon 16 forms, with a mass plan 18 deposited on the other side of the substrate, the correction capacitor. A discrete capacitor 19 completes the unit.

One can therefore see that in this technology, the correction capacitor 16 is integrated quite naturally between the two semi-inductances 10, 12. One need only regulate the width of the micro-ribbon 16 to obtain the appropriate capacitance Cc.

Figure 16:
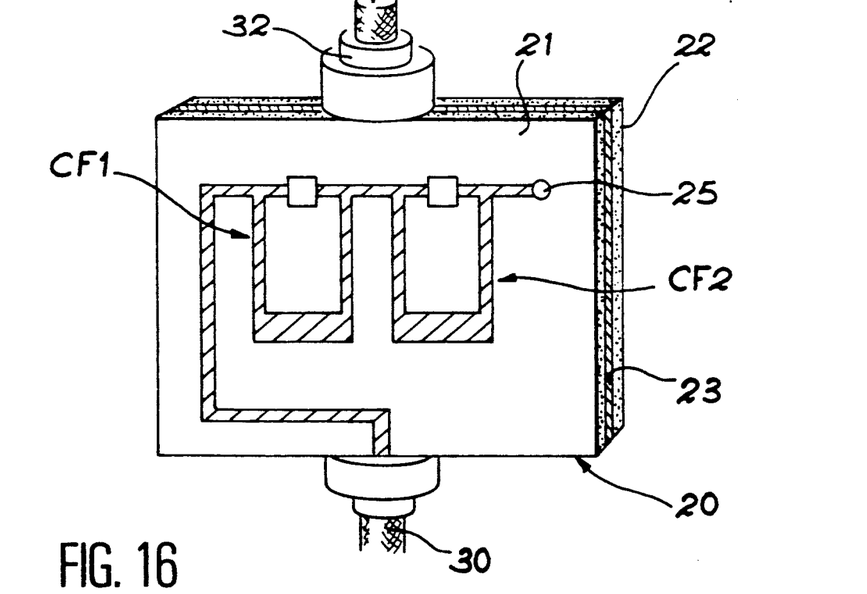
FIG. 16 shows a four-cell folded micro-ribbon filter.

Several cells of this type can be placed end to end on the same substrate. One may also fold the substrate as shown in FIG. 16. A substrate 20 consists of two insulating plates 21 and 22 separated by a conductive plane 23. On the front of the plate 21, there are two filtering cells similar to the one in FIG. 15, or CF1 and CF2. A metallized hole 25 (insulated from the plane 23) makes it possible to establish an electrical connection with the back of the plate 22, which has two cells like CF1 and CF2 (not visible in the Figure). The input and output of the filter is handled by the connectors 30 and 32, respectively.

Figure 17:
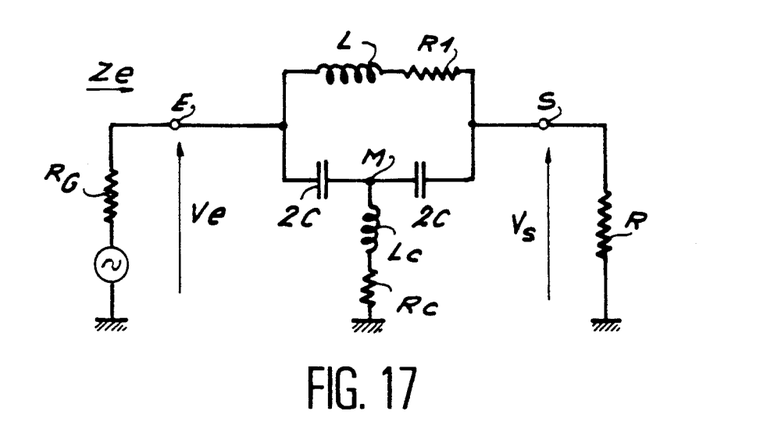
FIG. 17 shows a filter according to the invention in a mode of execution where the correction is carried out by an inductance connected between two capacitors.

The different methods of execution which have just been described correspond to a case where correction is carried out on the inductance of the resonant circuit by an ad hoc quality coefficient capacitor. But the invention covers a case where correction is carried out on the capacitor of the resonant circuit with an inductance associated with a resistor. The corresponding cell is illustrated in FIG. 17. The capacitor is split into two capacitors with a value of 2c connected in series with a midpoint M. Between this point and the mass, an inductance with a value Lc and a correction resistor Rc in series are connected. Moreover, the main inductance L is associated with a resistor R1, and R1 is connected to the quality factor L. The other media are identical to those in FIG. 4

Figure 18A:
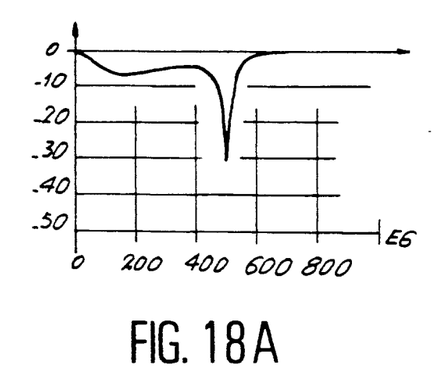
FIGS. 18A, 18B, 18C illustrate the performance obtained by the filter in the preceding figure.
Figure 18B:
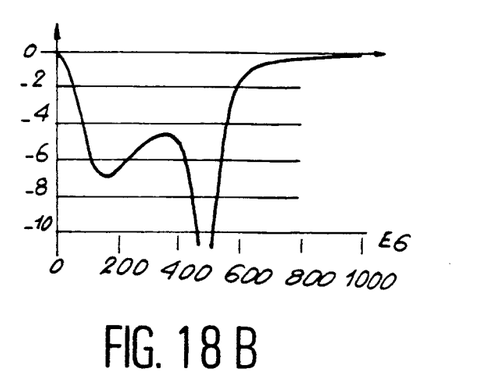
Figure 18C:
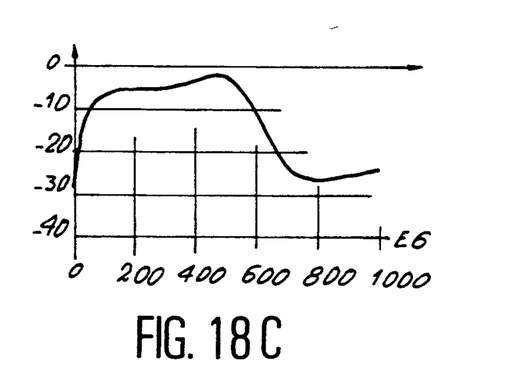

FIGS. 18A, B, C illustrate the performance obtained. The results shown should be compared with the results illustrated in FIGS. 3B, 3D and 3F, respectively, compared to a cell of the prior state of the art. One can see, particularly in FIG. 18A, an attenuation of $-32$ dB at the rejection frequency (compared with $-28$ dB); in FIG. 18B losses from 0.4 dB to 800 MHz and from 1.5 dB to 600 MHz (compared to 1.2 and 2.5 dB, respectively); and lastly, in FIG. 18C a mismatch of $-26$ dB to 800 MHz (compared to $-13$ dB).

The theoretical and experimental work of the inventors has shown that there is a wide choice of values for the correction elements Lc and Rc The maximum value of Lc is $\frac{1}{2}R_1C^2w_0^3$ and in this case the correction resistance Rc is equal to $L_cw_0$. Then, there must be $$L = \frac{2}{Cw_0^2} - Lc\frac{R1}{Rc}$$

If a value of Lc is chosen that is lower than the maximum value, then Rc can have two values:

$$Rc1 = \frac{1 + \sqrt{A}}{2K} \text{ or } Rc2 = \frac{1 - \sqrt{A}}{2K}$$

with $K = R1C^2w_0^2$
and $A = 1 - 4K^2Lc^2w_0^2$
and it is still necessary to require $$L = \frac{2}{Cw_0^2} - Lc\frac{R1}{Rc}$$

In these equations, L and R1 are the inductance of the resonant circuit with its associated interference resistor which determines the quality coefficient, C is the capacitance of the capacitor of the resonant circuit, $w_0$ is the resonance pulsation chosen with $w_0 = 2\pi Fo$, where Fo is the resonance frequency.

We claim:
1. A filtering cell to be connected to a load impedance of value R comprising:
   a resonant circuit having a first inductor and a first capacitor, said first inductor and capacitor being connected in parallel, said first inductor having an inductance L and a resistance r and having a quality factor of value Lw/r at a pulsation w, said first inductor being separated into two identical inductors each having an inductance equal to half the inductance of said first inductor, said two identical inductors being connected in series with a midpoint therebetween,
   a second capacitor connected to said midpoint, said second capacitor having a capacitance Cc substantially equal to $L/R^2$, and a resistance $R_c$, said second capacitor having a quality factor of value CcRcw at said pulsation w, said quality factor CcRcw being substantially equal to the quality factor Lw/r of said first inductor.
2. A filtering cell according to claim 1, wherein said first inductor consists of two conductive micro-ribbons deposited on one side of an insulating substrate, and said second capacitor consists of a conductive micro-ribbon deposited on said substrate between said two conductive micro-ribbons, with a conductive plane deposited on the other side of the substrate.
3. A filter including a plurality of filtering cells, wherein at least one of those cells conforms to the cell according to any one of claims 1 or 2.

* * * * *